United States Patent [19]
Torihata et al.

[11] Patent Number: 5,340,010
[45] Date of Patent: Aug. 23, 1994

[54] BONDING APPARATUS

[75] Inventors: Minoru Torihata; Osamu Nakamura, both of Tokyo, Japan

[73] Assignee: Kabushiki Kaisha Shinkawa, Tokyo, Japan

[21] Appl. No.: 869,486

[22] Filed: Apr. 15, 1992

[30] Foreign Application Priority Data

Apr. 16, 1991 [JP] Japan .................. 3-109689

[51] Int. Cl.5 .................. H01C 21/607; B23K 20/10
[52] U.S. Cl. .................. 228/1.1; 228/110.1
[58] Field of Search .................. 228/1.1, 4.5, 110.1, 228/180.5

[56] References Cited

U.S. PATENT DOCUMENTS

| | | | |
|---|---|---|---|
| 5,060,841 | 10/1991 | Oshima et al. | 228/180.5 |
| 5,115,960 | 5/1992 | Shimizu | 228/180.5 |
| 5,158,223 | 10/1992 | Shimizu | 228/180.5 |
| 5,221,037 | 6/1993 | Terakado et al. | 228/180.5 |

FOREIGN PATENT DOCUMENTS

| | | | |
|---|---|---|---|
| 61-101039 | 5/1986 | Japan | 228/110.1 |
| 62-031134 | 2/1987 | Japan | 228/110.1 |
| 62-123728 | 6/1987 | Japan | 228/110.1 |
| 62-276841 | 12/1987 | Japan | 228/110.1 |

Primary Examiner—Samuel M. Heinrich
Attorney, Agent, or Firm—Koda and Androlia

[57] ABSTRACT

This invention is intended to reduce the size of a bonding apparatus and includes a first means which is to construct the bonding apparatus by swingably mounting a lifter arm 4 for holding a horn 2 to the upper Y table 9 of an X-Y table 10. The second means is to construct the apparatus by using the upper Y table of the X-Y table as a bottom plate of a bonding head, and the third means is that in addition to the second means, it is further arranged so that a linear motor 15 is fixed such that a part or the entire portion of a magnet section 16 of the linear motor 15 is embedded in the Y table 9, while a coil section 17 of the linear motor 15 is fixed to the lifter arm 4.

2 Claims, 4 Drawing Sheets

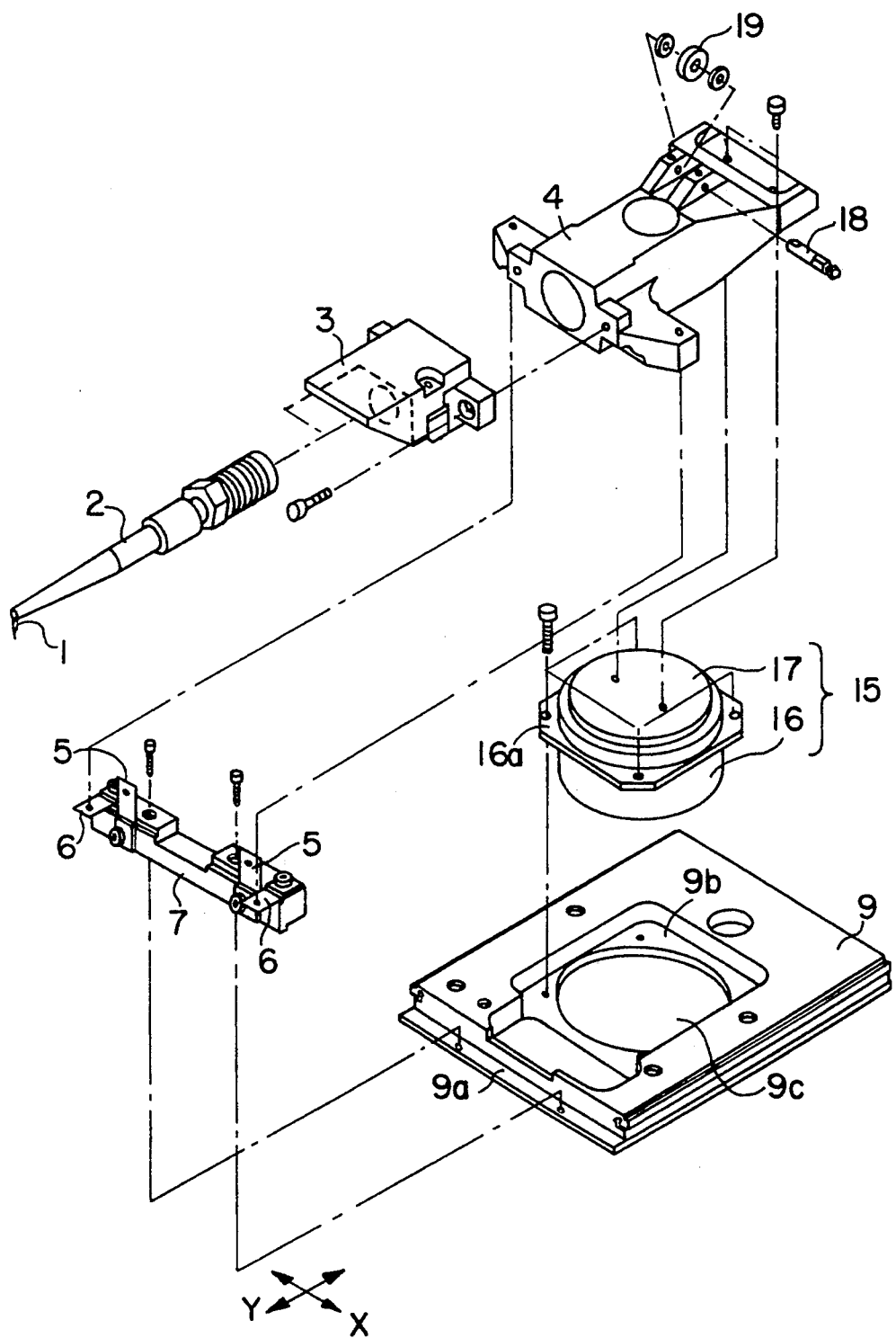
F I G. 1

BONDING APPARATUS

BACKGROUND OF THE INVENTION

1. Field of the Invention

The present invention relates to a bonding apparatus.

2. Prior Art

Conventional bonding apparatuses have a bonding head fixed on an X-Y table, a lifter arm rotatably provided on the bonding head, a motor for swinging the lifter arm that moves a capillary up and down, and a horn for holding the capillary provided on the lifter arm. In other words, the most of the main components of the bonding apparatus are integrated into the bonding head as a unit and fixed onto the X-Y table.

In the conventional bonding apparatus described above, since the most of the main components of the bonding apparatus are provided in the bonding head which is fixed onto the X-Y table, the bonding apparatus is high and large.

SUMMARY OF THE INVENTION

Accordingly, the object of the present invention is to provide a bonding apparatus that can be constructed small in size.

In order to achieve the object described above, the bonding apparatus of the present invention is characterized in that a lifter arm for holding a horn is rotatably provided on an upper table of an X-Y table.

The object of the present invention is also accomplished by another means that is characterized in that the upper table of the X-Y table is used as a bottom plate of a bonding head.

Furthermore, the object of the present invention is further achieved by a means characterized in that, in addition to use the upper table of the X-Y table as the bottom plate of the bonding head, a part of or the entirety of a magnet section of the linear motor is installed in the upper table of the X-Y table, while a coil section of the linear motor is fixed to the lifter arm to which the horn is rotatably provided.

According to the first means of the present invention, since the lifter arm is attached to the upper table, the mounting position of the lifter arm can be lowered, and the height of the bonding head can also be lowered to the extent equivalent to the height reduction of the lifter arm.

According to the second and the third means, the linear motor is used for applying the bonding load to the capillary attached to the lifter arm or for swinging the lifter arm that moves the capillary up and down. As a result, the magnet section of the linear motor is embedded in the upper table of the X-Y table, and the mounting position of the linear motor can be lowered. Therefore, the height of the bonding head can be lowered proportionally to the lowering amount of the linear motor.

BRIEF DESCRIPTION OF THE DRAWINGS

FIG. 1 is a perspective view of an embodiment of the present invention which illustrates a portion of the bonding apparatus to be combined with another portion shown in FIG. 2;

DETAILED DESCRIPTION OF THE INVENTION

One embodiment of the present invention will be described with reference to FIGS. 1 through 5.

Figure 3:
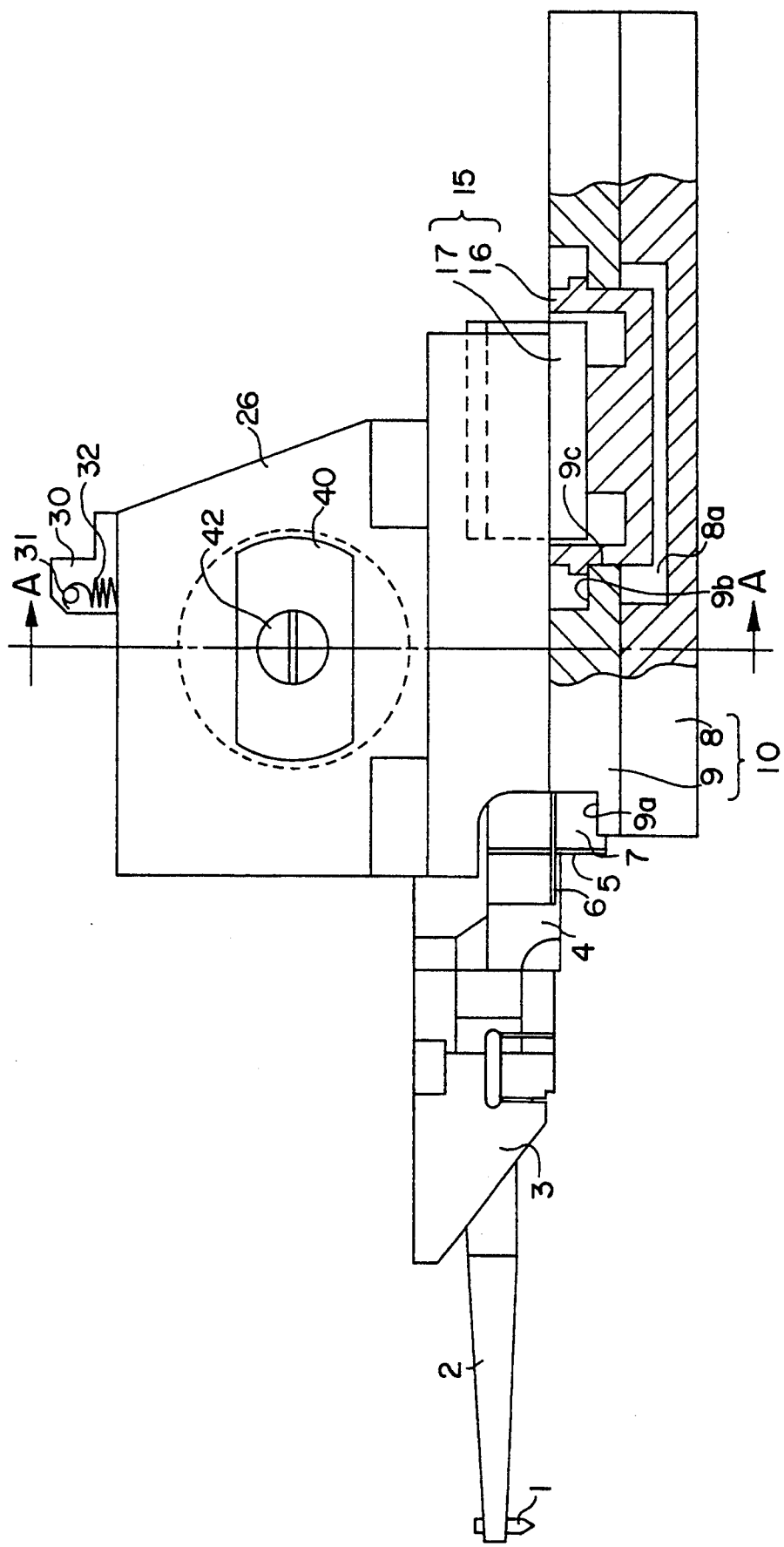
FIG. 3 is a schematic partially sectional side view of the portions shown in FIG. 1 and FIG. 2.

As shown in FIG. 1 and FIG. 3, a capillary 1 is mounted on one end of a horn 2, and the other end of the horn 2 is connected to a horn holder 3. The horn holder 3 is mounted to a lifter arm 4 to which one end of each one of plate springs 5 and 6 are connected. The plate springs 5 are disposed vertically and the plate springs 6 are disposed horizontally, and another end of each one of the plate springs 5 and 6 are connected to a fulcrum block 7.

An X-Y table 10 is comprised of an X table 8 and a Y table 9. The Y table 9 is positioned on the X table 8. The fulcrum block 7 is provided on a fulcrum block mount 9a formed at a lower position of the front side of the Y table 9 of the X-Y table 10.

A linear motor 15 is comprised of a magnet section 16, a coil section 17, and a fitting section 16a. A linear motor mount 9b is formed on the Y table 9 so that the fitting section 16a is embedded therein. The linear motor 15 is thus fixed in the linear motor mount 9b. . In addition, holes 8a and 9c are formed in the X table 8 and the Y table 9, respectively, for housing the magnet section 16 of the linear motor 15 therein. The hole 8a provided on the X table 8 is an elongated shape along the Y direction so that the magnet section 16 of the linear motor 15 can be moved in the Y direction without any interference with the X table 8.

The lifter arm 4 is provided on the coil section 17 of the linear motor 15, and a shaft 18 on which a roller 19 is rotatably provided is fixed on the lifter arm 4.

Figure 2:
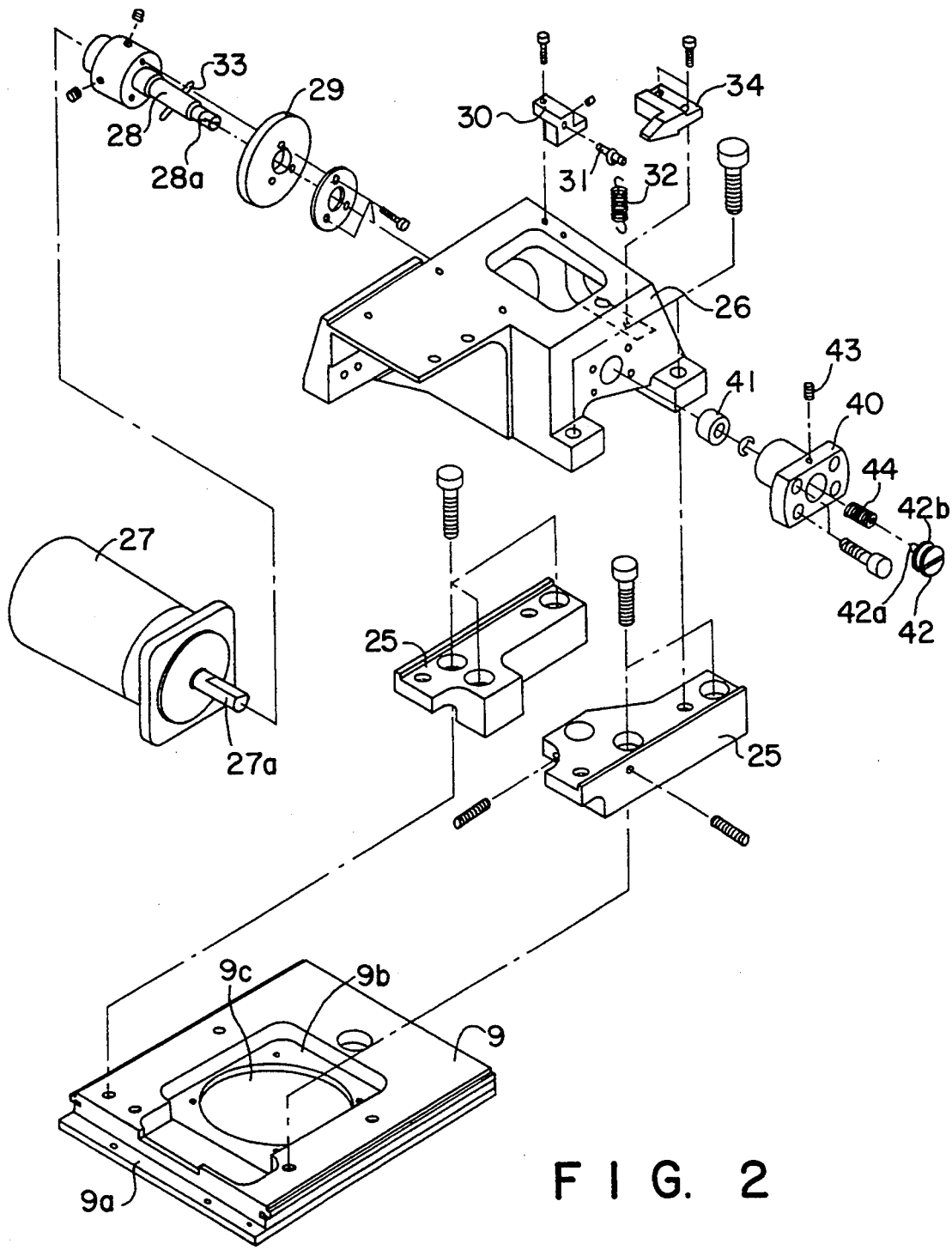
FIG. 2 is a perspective view of another embodiment of the present invention which illustrates an other portion of the bonding apparatus.
Figure 4:
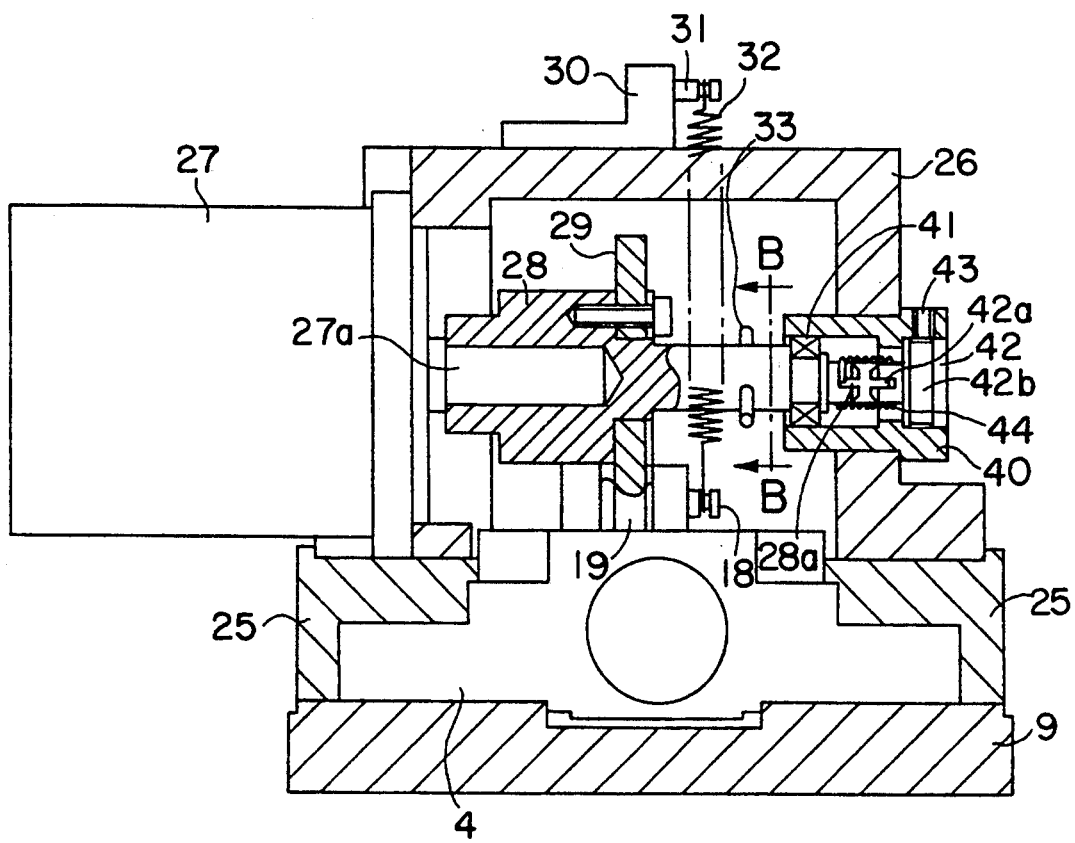
FIG. 4 is a sectional view taken along the line A—A in FIG. 3.

As shown in FIG. 2 and FIG. 4, a pair of mounting plates 25 are attached to the Y table 9. The mounting plates 25 are used for installing a detector (not shown) that detects the touchdown of the capillary to a sample.

A casing 26 is provided on the mounting plates 25, and a motor 27 that can rotate forward and backward is fixed to the casing 26. A cam shaft 28 with a spring groove 28a at the end is connected to an output shaft 27a of the motor 27, and a cam 29 is provided on the cam shaft 28 so that the outer circumference of the cam 29 is in contact with the outer circumference of the roller 19.

A spring peg fixing plate 30 with a spring peg 31 is fastened to the casing 26, and a spring 32 is hooked up between the spring peg 31 and the shaft 18. As a result, the roller 19 is urged by the spring 32 to contact with the cam 29.

Figure 5:
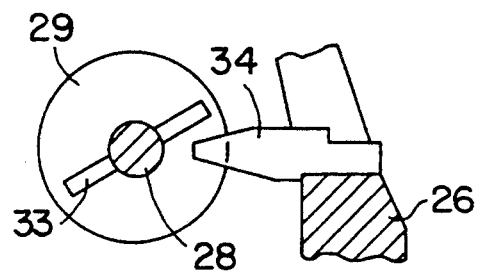
FIG. 5 is a partial sectional view taken along the line B—B in FIG. 4.

In order to control the rotating range of the cam shaft 28, a pin 33 is provided on the cam shaft 28 so that the both ends of the pin 33 protrude from the cam shaft 28, and a stopper 34 is provided on the casing 26 so that the tip end of the stopper 34 comes into contact with the pin 33 when the cam shaft 28 is rotated as shown in FIG. 5.

Therefore, in this embodiment, the cam shaft 28 is rotated back and forth within the range of approximately 160 degrees. In the rotating range of the cam shaft 28, the profile of the cam 29 to which the roller 19 contacts is used as a descending profile when the motor 27 is rotated forward, while the profile is used as an ascending profile when the motor 27 is rotated backward.

A receiving member 40 is installed at the side wall of the casing 26, and a bearing 41 is provided in the receiving member 40 so that the front end of the cam shaft 28 is rotatably supported by the receiving member 40. A spring peg 42 having a spring hooking groove 42a and a groove 42b is provided in the receiving member 40 and fixed by a screw 43 that is fit into the groove 42b.

A spring 44 positioned in the receiving member 40 is hooked up between the spring hooking groove 42a of the spring peg 42 and the spring peg groove 28a of the cam shaft 28. The spring 44 urges the cam shaft 28 so that the cam shaft 28 is rotated reversely. The force of the spring 44 can be controlled by the spring peg 42 that can be rotated after loosing the screw 43.

As seen from the above, the lifter arm 4 is provided on the Y table 9 via the plate springs 5 and 6, and the horn 2 is connected to the lifter arm 4 by the horn holder 3. Accordingly, the capillary 1 connected to the horn 2 is moved with the Y table in the X-Y direction when the X-Y table 10 is driven in the X-Y direction by a driving means (not shown).

Since the roller 19 provided on the lifter arm 4 is kept in contact with the cam 29 by the spring 32, the roller 19 is moved upwardly when the motor 27 rotates forward. As a result, the lifter arm 4 is swung by using the plate springs 5 and 6 as fulcrums, so that the capillary 1 is moved downwardly. In the same way, when the motor 27 rotates reversely or backward, the roller 19 is moved downwardly, so that the capillary 1 is moved upwardly.

Next, the operation of the bonding apparatus of the present invention will be described below.

A ball is formed by an electric torch (not shown) at the end of a wire (not shown) that passes through the capillary 1, then the X-Y table 10 is driven so that the capillary 1 is positioned above the first bonding point.

After these movements, the motor 27 rotates forward and the capillary 1 is moved downwardly by the cam 29 that urges the roller 19 downwardly. Therefore, the ball comes into contact with the first bonding point. The bonding level of the first bonding point is detected by a detector (not shown), and the motor 27 stops for a predetermined period of time after the detection.

The linear motor 15 is actuated by the detection signal from the detector, and the coil 17 is repulsed by the magnet 17. As a result, the lifter arm 4 is pushed up and swung by using the spring plates 5 and 6 as fulcrums, and the capillary 1 presses the ball against the first bonding point. More specifically, the bonding load of the capillary 1 is determined by the electric current or voltage applied to the linear motor 15, and the ball is bonded to the first bonding point by the bonding load of the capillary.

The linear motor 15 stops after a predetermined period of time has passed, and then the motor 27 rotates reversely. As a result, the capillary 1 is moved upwardly. The rotation of the motor 27, that is, the upward movement of the capillary 1, is determined based upon the signal of the bonding level detected by the detector so that an enough length of the wire is fed out of the tip end of the capillary 1 to form a wire-loop.

Next, the X-Y table is driven to bring the capillary 1 to a position above the second bonding point. Thereafter, the wire is bonded to the second bonding point by the operation similar to that taken for the bonding to the first bonding point as described above. After the wire is bonded to the second bonding point, the clamper (not shown) is closed to hold the wire, and the capillary 1 is moved upwardly a predetermined distance. As a result, the wire is cut off from the point that is above the second bonding point.

In the embodiment described above, the plate springs 5 and 6 are fixed to the fulcrum block 7, and the fulcrum block 7 is fixed to the upper level Y table 9. However, the plate springs 5 and 6 may be fixed directly to the Y table 9.

Furthermore, in the embodiment, the bonding load is applied and controlled by the linear motor 15 and the spring 32. However, only the spring 32 without using the linear motor 15 can be used for applying the bonding load by increasing the spring force of the spring 32. It only the linear motor 15 is used, the springing force of the spring 32 may be set to be weaker, and the magnitude of the bonding load can be readily controlled by the electric current or voltage that is applied to the linear motor 15.

Instead of using the motor 27, it is also possible to move the capillary 1 vertically by the lifter arm 4 that is swung by the linear motor 15.

As described above, by mounting the lifter arm 4 to the Y table 9 of the X-Y table 10, the mounting position of the linear arm 4 is lowered. Therefore, the height of the bonding head 26 can be lowered to the extent equal to the lowered height of the lifter arm 4. The height of the bonding head 26 can also be lowered to the extent equivalent to the height of the bottom plate by using the Y table 9 of the X-Y table 10 as the bottom plate of the bonding head 26.

Furthermore, if the linear motor 15 is used for applying the bonding load to the capillary 1 attached to the lifter arm 4 or for moving the capillary 1 vertically by swinging the lifter arm 4, the mounting position of the linear motor 15 can become lower by fixing a part or the entirety of the magnet section 16 of the linear motor 15 within the Y table 9. As a result, the bonding head 26 can be lowered as much as the linear motor 15 is lowered.

According to the present invention, since the lifter arm for holding the horn is rotatably mounted on the upper table of the X-Y table, the height of the bonding head can be lowered to the extent equivalent to the height reduction of the lifter arm.

In addition, since the upper table of the X-Y table is used as the bottom plate of the bonding head, the bonding head can be set at a lower position proportional to the thickness of the bottom plate.

Furthermore, in addition to use the upper table of the X-Y table as the bottom plate of the bonding head, a part of or the entirety of the magnet section of the linear motor 15 is fixed within the upper table position, while the coil side portion of the linear motor is fixed to the lifter arm to which the horn is fixed and swings. As a result, the mounting position of the linear motor becomes lower.

Therefore, the bonding head can be lowered as much as the linear motor is lowered.

We claim:

1. A bonding apparatus for semiconductors comprising:
    an XY table;
    an elongated hole formed in an X table of said XY table, said elongated hole extending along a Y direction;

a mounting hole provided in a Y table of said XY table;

a linear motor wherein a magnet section of said linear motor is mounted in said mounting hole and extends into said elongated hole;

a lifter arm provided on a coil section of said linear motor; and a horn provided on said lifter arm;

whereby said Y table is used as a bottom plate of a bonding head and the size of said bonding apparatus is reduced.

2. A bonding apparatus wherein an upper table of an X-Y table is used as a bottom plate of a bonding head, a linear motor is fixed to said upper table such that a magnet section of said linear motor is positioned partially or entirely, within said upper table, and a coil section of said linear motor is fixed to a lifter arm to which a horn is fixed.

* * * * *